(12) United States Patent
Hara

(10) Patent No.: US 7,191,599 B2
(45) Date of Patent: Mar. 20, 2007

(54) COOLING APPARATUS AND METHOD, AND EXPOSURE APPARATUS HAVING THE COOLING APPARATUS

(75) Inventor: Shinichi Hara, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/631,927

(22) Filed: Jul. 31, 2003

(65) Prior Publication Data
US 2004/0035570 A1    Feb. 26, 2004

(30) Foreign Application Priority Data
Jul. 31, 2002    (JP)    ............... 2002-222911

(51) Int. Cl.
*F25B 21/02*    (2006.01)
(52) U.S. Cl. ....................................... 62/3.7
(58) Field of Classification Search ........... 62/3.7, 62/3.2, 3.3, 3.4, 3.6; 355/30, 53, 67; 165/904; 365/67
See application file for complete search history.

(56) References Cited

U.S. PATENT DOCUMENTS

| | | | | |
|---|---|---|---|---|
| 3,212,274 A | * | 10/1965 | Eidus | 62/3.4 |
| 4,505,118 A | * | 3/1985 | Altman | 62/3.2 |
| 5,813,233 A | * | 9/1998 | Okuda et al. | 62/3.7 |
| 6,000,227 A | * | 12/1999 | Kroeker | 62/62 |
| 6,098,408 A | * | 8/2000 | Levinson et al. | 62/3.2 |
| 6,298,669 B1 | * | 10/2001 | Maruyama et al. | 62/3.2 |
| 6,326,610 B1 | * | 12/2001 | Muramatsu et al. | 250/238 |
| 6,509,951 B2 | * | 1/2003 | Loopstra et al. | 355/30 |
| 6,939,899 B2 | * | 9/2005 | Buazza et al. | 523/106 |
| 6,992,306 B2 | * | 1/2006 | Honda et al. | 250/492.2 |
| 7,068,348 B2 | * | 6/2006 | Hara | 355/30 |
| 2003/0035088 A1 | | 2/2003 | Emoto | |

FOREIGN PATENT DOCUMENTS

| | | |
|---|---|---|
| JP | 2003-058258 | 2/2003 |
| JP | 2004-029314 | 1/2004 |
| JP | 2004-039696 | 2/2004 |

* cited by examiner

*Primary Examiner*—Mohammad M. Ali
(74) *Attorney, Agent, or Firm*—Morgan & Finnegan, L.L.P.

(57) ABSTRACT

A cooling apparatus for cooling an optical element provided in a vacuum atmosphere includes a radiational cooling part, arranged apart from the optical element, for cooling the optical element by radiation heat transfer, and a controller for controlling temperature of the radiation cooling part.

9 Claims, 9 Drawing Sheets

PRIOR ART

COOLING APPARATUS AND METHOD, AND EXPOSURE APPARATUS HAVING THE COOLING APPARATUS

This application claims a benefit of priority based on Japanese Patent Applications No. 2002-222911, filed on Jul. 31, 2002, which is hereby incorporated by reference herein in its entirety as if fully set forth herein.

BACKGROUND OF THE INVENTION

The present invention relates generally to cooling apparatuses, and more particularly to a cooling apparatus for cooling an optical element used in an exposure apparatus that exposes an object, such as a single crystal substrate for a semiconductor wafer (plate or ball), and a glass plate (wafer) for a liquid crystal display (LCD). The present invention is particularly suitable, for example, for an exposure apparatus that uses ultraviolet light and extreme ultraviolet ("EUV") light as a light source for exposure.

A reduction projection exposure apparatus has been conventionally employed which uses a projection optical system to project a circuit pattern formed on a mask (reticle) onto a wafer, etc. to transfer the circuit pattern, in manufacturing such a fine semiconductor device as a semiconductor memory and a logic circuit in photolithography technology.

The minimum critical dimension to be transferred by the projection exposure apparatus or resolution is proportionate to a wavelength of light used for exposure, and inversely proportionate to the numerical aperture ("NA") of the projection optical system. The shorter the wavelength is, the better the resolution is. Along with recent demands for finer semiconductor devices, a shorter wavelength of ultraviolet light has been promoted from an ultra-high pressure mercury lamp (i-line with a wavelength of approximately 365 nm) to KrF excimer laser (with a wavelength of approximately 248 nm) and ArF excimer laser (with a wavelength of approximately 193 nm).

However, the lithography using the ultraviolet light has the limit to satisfy the rapidly promoting fine processing of a semiconductor device, and a reduction projection optical system using extreme ultraviolet ("EUV") light with a wavelength of 10 to 15 nm shorter than that of the ultraviolet (referred to as an "EUV exposure apparatus" hereinafter) has been developed to efficiently transfer a very fine circuit pattern of 0.1 μm or less.

The light absorption in a material remarkably increases as the wavelength of the exposure light becomes shorter, and it is difficult to use a refraction element or lens for visible light and ultraviolet light. In addition, no glass material exists in a wavelength range of the EUV light, and a reflection-type or cataoptric optical system uses only a reflective element or mirror.

The mirror does not reflect all the exposure light, but absorbs the exposure light of 30% or greater. The absorbed exposure light causes residual heat, deforms a surface shape of the mirror, and deteriorates its optical performance, in particular, imaging performance. Therefore, the mirror is made of a low thermal expansion glass, for example, having a coefficient of linear expansion of 10 ppb, so as to reduce a mirror's shape change as the temperature changes.

The EUV exposure apparatus is used for exposure of a circuit pattern of 0.1 μm, and has strictly limited critical dimension accuracy. Therefore, the mirror's surface shape is permitted to have deformation of only about 0.1 nm or less. Therefore, even the mirror's coefficient of linear expansion of 10 ppb would cause the temperature to rise gradually and the mirror's surface shape to change. For example, when the mirror has a thickness of 50 mm, the mirror's surface shape changes by 0.1 nm as the temperature rises by 0.2° C.

A common method cools a mirror 5000, as shown in FIG. 9, by coupling a joint 5100 to the mirror 5000, connecting a water pipe 5200 to the joint 5100, and supplying coolant, such as the water, to a channel 5300 formed in the mirror 5000. Here, FIG. 9 is a view of a conventional method for cooling the mirror 5000, wherein FIG. 9A is a schematic transparent plane view of the mirror 5000, whereas FIG. 9B is a schematic sectional view of the mirror 5000.

The low thermal expansion glass for the mirror 5000 is, however, so soft that a force generated in coupling the mirror 5000 to the joint 5100 deforms the surface shape of the mirror 5000 by 0.1 nm. In addition, pressure to flow the coolant through the channel 5300 in cooling the mirror 5000 also deforms the surface shape of the mirror 5000.

It is conceivable to use convective heat transfer to cool the mirror in a non-contact manner without applying a force to the mirror, such as blowing gas to the mirror. However, the EUV exposure apparatus cannot use air because it maintains an atmosphere of an exposure optical path to be high vacuum, for example, about $1 \times 10^6$ [Pa] so that a reaction between the residual gas component in the exposure optical path, such as polymer organic gas, and EUV light may not contaminate a mirror surface and lower its reflectance.

BRIEF SUMMARY OF THE INVENTION

Accordingly, it is an exemplary object of the present invention to provide a cooling apparatus and method, and an exposure apparatus having the cooling apparatus adjustment method and apparatus for adjusting an optical system, and an exposure apparatus, which provide intended optical performance by reducing deformation of an optical element due to thermal expansion that would otherwise deteriorate imaging performance.

A cooling apparatus of one aspect according to the present invention for cooling an optical element provided in a vacuum atmosphere includes a radiational cooling part, arranged apart from the optical element, for cooling the optical element by radiation heat transfer, and a controller for controlling temperature of the radiational cooling part. The cooling apparatus may further include a sensor for detecting temperature of the optical element, wherein the controller controls the radiational cooling part so that the temperature detected by the sensor may be a predetermined value.

The controller may include a coolant feed part, formed in the radiational cooling part, for flowing coolant along a channel for coolant to flow through. The temperature of the coolant may be set to be substantially constant. The controller may control temperature of the radiational cooling part so that temperature of the optical element may be a predetermined value and temperature of the coolant is substantially the same as the predetermined value.

The cooling apparatus may further include a radiation shielding member that prevents the radiational cooling part from absorbing the heat from a member other than the optical element.

The radiational cooling part may include a cold plate forms a temperature difference from the optical element, a Peltier element, controlled by the controller and coupled with the cold plate, for cooling the cold plate using a Peltier effect, and a radiator block that includes a channel for coolant to flow through, and draws heat from the Peltier element, wherein the controller has a coolant feed part for flowing the coolant along the channel. Temperature of the coolant may be set to be substantially constant. The controller may control temperature of the radiational cooling part so that temperature of the optical element may be a predetermined value, and temperature of the coolant is substantially the same as the predetermined value. The cooling apparatus may further include a radiation shielding member that prevents the radiational cooling part from absorbing the heat from a member other than the optical element.

The optical element may be a mirror, wherein the radiational cooling part is provided on a rear surface side of the mirror. The coolant feed part flows the coolant along the channel. The optical element may be a mirror.

A method of another aspect according to the present invention for cooling an optical element located in a vacuum atmosphere includes the steps of sensing temperature of the optical element, and cooling a plate so that the temperature of the optical element detected by the sensing step may become a predetermined value, the plate being arranged apart from the optical element and absorbing heat from the optical element. The cooling step may flow coolant having substantially constant temperature to a channel formed in a radiator block provided at a heat exhaust side of a Peltier element connected to the plate. The cooling step may flow coolant having temperature that is substantially the same as a predetermined value to a channel formed in a radiator block provided at a heat exhaust side of a Peltier element connected to the plate.

An exposure apparatus of another aspect according to the present invention that exposes an object using a pattern on a reticle or mask includes a cooling apparatus, and an optical system that includes at least one optical element disposed in a vacuum atmosphere, wherein the cooling apparatus includes a radiational cooling part, arranged apart from the at least optical element, for cooling the optical element by radiation heat transfer, and a controller for controlling temperature of the radiation cooling part. The optical element included in the optical system may be a mirror arranged in an optical path from the reticle or the mask to the object. Light that passes from the reticle or the mask to the object trough the optical system may have a wavelength of 10 nm to 15 nm.

A device fabrication method of another aspect of the present invention includes the step of exposing an object using an exposure apparatus, and performing a development process for the object exposed. Claims for a device fabrication method for performing operations similar to that of the above exposure apparatus cover devices as intermediate and final products. Such devices include semiconductor chips like an LSI and VLSI, CCDs, LCDs, magnetic sensors, thin film magnetic heads, and the like.

Other objects and further features of the present invention will become readily apparent from the following description of the preferred embodiments with reference to accompanying drawings.

BRIEF DESCRIPTION OF THE DRAWINGS

FIG. 9 is a view of a conventional mirror cooling method, wherein

DETAILED DESCRIPTION OF THE PREFERRED EMBODIMENTS

Figure 1:
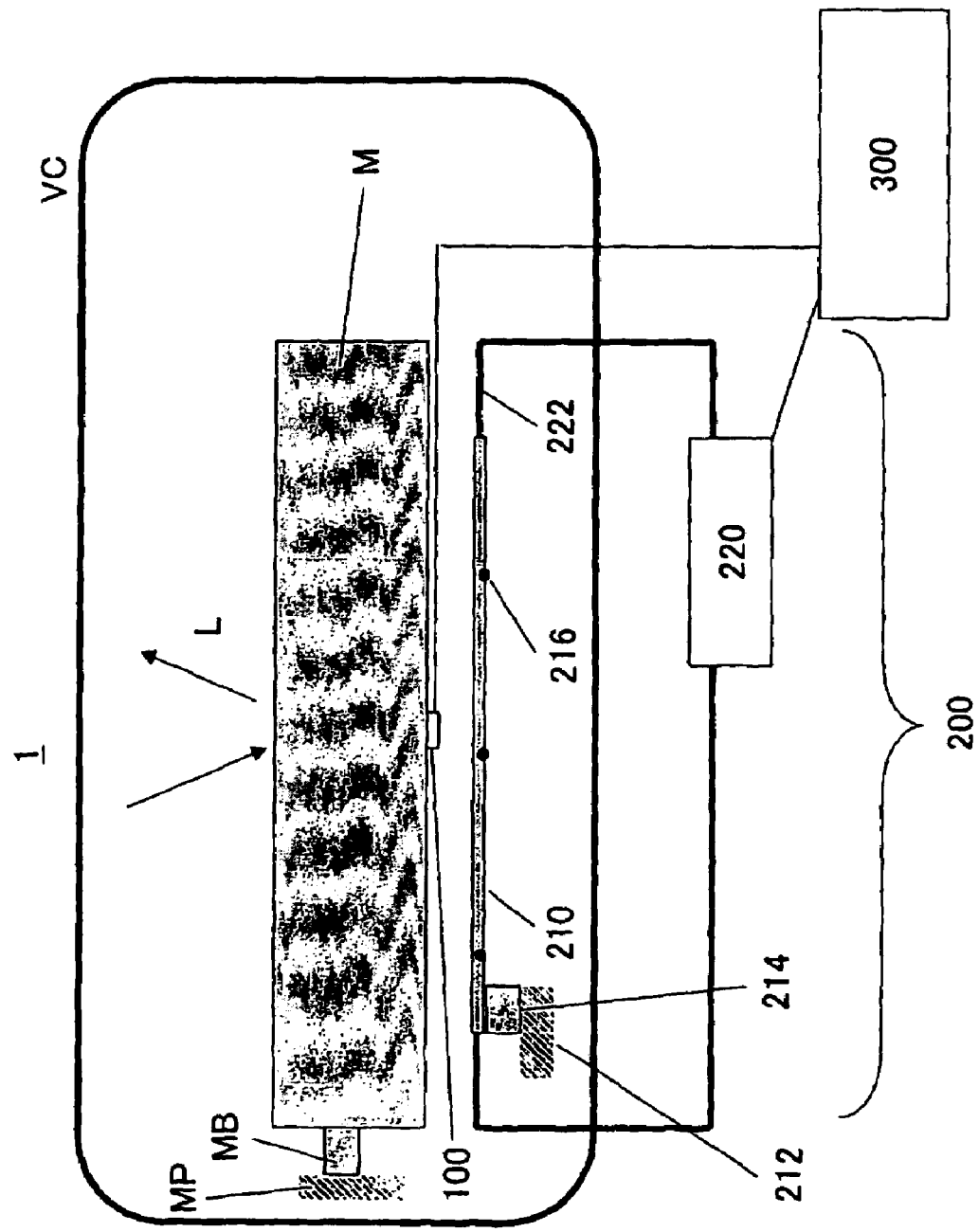
FIG. 1 is a schematic structure of a cooling apparatus of one aspect according to the present invention.

With reference to accompanying drawings, a description will now be given of a cooling apparatus and method as one embodiment according to the present invention. In each figure, the same reference numeral denotes the same element, and a duplicate description will be omitted. Here, FIG. 1 is a schematic structure of a cooling apparatus 1 of one aspect according to the present invention.

The cooling apparatus 1 is one for cooling an optical element M provided in a vacuum chamber VC. The vacuum chamber VC is maintained to be high vacuum, for example, about $1 \times 10^6$ [Pa] by a vacuum pump (not shown) so that a reaction between the residual gas component in the exposure optical path, such as polymer organic gas, and EUV light may not contaminate a mirror surface and lower its reflectance. The optical element M is located at a predetermined position via an optical-element support member MV that is supported by an optical-element support stool MP in the vacuum chamber VC, and images light using reflection, refraction, diffraction, etc. The optical element M includes, for example, a lens, a parallel plate glass, a prism, a mirror, and a Fresnel zone plate, a kinoform, a binary optics, a hologram, and other diffraction optical elements. The instant embodiment describes the optical element M as a mirror. The cooling apparatus 1 includes, as shown in FIG. 1, a detector 100, a radiation cooling mechanism 200, and a controller 300.

The detector 100 is attached to the optical element M outside an illumination area onto which exposure light L is irradiated, and detects the temperature of the optical element M. An irradiation of the exposure light L would form a temperature distribution so that the illumination area becomes at high temperature and other area becomes at lower temperature. The detector 100 is adapted to detect the average temperature of the entire optical element M, and sends the detected temperature of the optical element M to the controller 300, which will be described later. The detector 100 includes a temperature sensor, such as a thermocouple, a resistor temperature sensor, and an infrared temperature sensor. While the detector 100 is attached to or contacts the optical element M In the instant embodiment, the detector 100 may be provided apart from the optical element M and detect the temperature of the optical element M.

The radiation cooling mechanism 200 is provided at a position opposite to and apart from the optical element M (at a side opposite to an incident side of the exposure light L), and absorbs the heat from the optical element M through radiation. The radiation cooling mechanism 200 includes a radiation plate 210, and a circulation part 220.

The radiation plate 210 is fixed apart by an interval C from the optical element M through a radiation-plate support member 214 supported by a radiation-plate support stool 212. The interval C between the radiation plate 210 and the optical element M is preferably short to improve the heat absorption efficiency from the optical element M. The radiation-plate support stool 212 and member 214 are made of generally lightweight and hard ceramics having a small coefficient of linear expansion. Since the optical-element support stool MP is structurally separated from the radiation-plate support stool 212, the vibrations of the radiation plate 210 and radiation plate support stool 212 are prevented from transmitting to the optical element M when coolant flows through the channel 216 formed in the radiation plate 210. Therefore, the optical element M does not deform its surface shape due to the vibration and may secure desired optical performance.

The radiation plate 210 has the channel 216 for the coolant supplied by the circulation part 220, which will be described later, to flow through. The channel 216 is connected to the circulation part 220 through a pipe 222. The channel 216 is formed over its entire surface of the radiation plate 210, and coolant is adapted to flow uniformly over the entire surface of the radiation plate 210. The radiation plate 210 is cooled by the coolant, becomes at a low temperature, and forms a temperature difference relative to the optical element M. The radiation plate 210 absorbs the heat from the optical element M due to the temperature difference from the optical element M. The radiation plate 210 is made of a material having comparatively good heat conductivity and high emissivity, such as aluminum nitride of ceramics (AlN).

The circulation part 220 is connected to a pipe 222, and supplies to the channel 216 and circulates coolant through the channel 216 via the pipe 222. The coolant flows through the channel 216 formed in the radiation plate 210 and cools the radiation plate 210. The temperature of the coolant determines the temperature of the radiation plate 210 to be cooled. The instant embodiment supplies and circulates the coolant as water (liquid), but may use gas. While the instant embodiment circulates coolant, the circulation does not have to be necessary and a feed part for feeding the coolant and an ejection part for ejecting the coolant. Alternatively, a coolant box may be provided to accommodate the coolant that has passed through the channel, and to supply the coolant from it. A provision of the coolant box would comparatively facilitate to maintain temperature of coolant.

The controller 300 controls the radiation cooling mechanism 200 so that the temperature of the optical element M detected by the detector 100 may have the predetermined value. More specifically, the controller 300 controls the temperature of the radiation plate 210 by changing the temperature of the coolant to be supplied and circulated through (the channel 216 in) the radiation plate 210. This control adjust the heat value absorbed the optical element M, and maintains the temperature of the optical element M to the predetermined value. In other words, the controller 300 serves to maintain the temperature of the optical element M to be constant.

For example, heat flow velocity density Q as the heat value which a material Y having absolute temperature $T_2$ [K] and area $A_2$ [m²] absorbs from a material X having absolute temperature $T_1$ [K] and area $A_1$ [m²] is given by the following equation where $E_1$ is emissivity of the material X, $E_2$ is emissivity of the material Y, $F_{12}$ is radiation mode coefficient (or a ratio of energy which has been emitted from the material X and reached the material Y), $T_1 > T_2$, and $5.67 \times 10^{-8}$ is Stefan-Boltzmann constant:

$$Q = 5.67 \times 10^{-8} \times (T_1^4 - T_2^4)/((1-E_1)/(E_1 \times A_1) + (1/(A_2 \times F_{12})) + (1-E_2)/(E_2 \times A_2))$$

For example, when the optical element M absorbs the exposure light L of 1.5 [W], in order to maintain the temperature of the optical element M to be a predetermined value, e.g., 23° C., and enable the radiation plate 210 to absorb the heat of 1.5 [W], the controller 300 should control the temperature of the radiation plate 210 to be around 10° C. Thus, the controller 300 controls the temperature of the coolant to be around 10° C., which the circulation part 220 supplies and circulates, so as to maintain the temperature of the radiation plate 210 to be around 10° C.

As discussed, when the optical element M has the thickness of 50 mm, the temperature rise of 0.2° C. would deform the surface shape of the optical element M by 0.1 nm. Thus, the controller 300 preferably controls the temperature of the optical element M to be less than 1° C., preferably 0.2° C. below the predetermined value.

Figure 2:
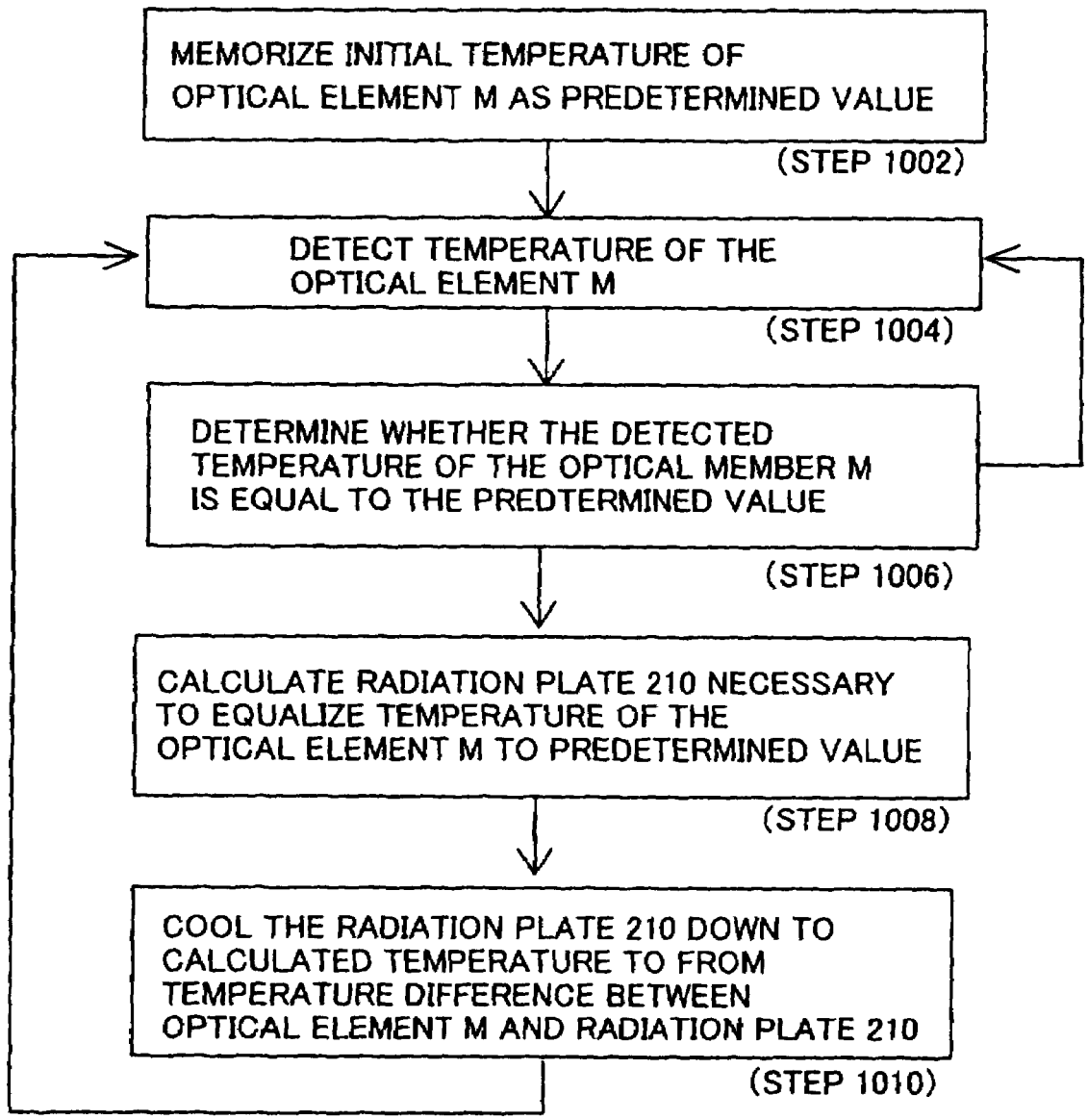
FIG. 2 is a flowchart for explaining a cooling method for cooling an optical member provided in a vacuum atmosphere.

A description will now be given of the cooling method of the optical element M using the cooling apparatus 1, with reference to FIG. 2. FIG. 2 is a flowchart for explaining the cooling method 1000 for cooling the optical element M provided in the vacuum atmosphere.

The detector 100 detects the temperature of the optical element M at the initial state or when the exposure light L is not irradiated onto the optical element M, and sends the detected initial temperature to the controller 300. The controller 300 memorizes the received initial temperature of the optical element M as the predetermined value (step 1002). It is assumed that the optical element M does not change the surface shape in the initial state. When the exposure light L is irradiated onto the optical element M, the detector 100 detects the temperature of the optical element M (step 1004). The temperature of the optical element M detected by the detector 100 is sent to the controller 300, which in turn determines whether the temperature of the optical element M detected by the detector 100 is equal to the predetermined value (step 1006). When the detected temperature of the optical element M is equal to the predetermined value, the procedure from the step 1004 is repeated during exposure or while the exposure light L is irradiated onto the optical element M. When the detected temperature of the optical element M is different from the predetermined value, the controller 300 calculates the temperature of the radiation plate 210 necessary enable the temperature of the optical element M to be equal to the predetermined value (step 1008). The controller 300 calculates the heat value to be absorbed by the radiation plate 210, and determines the temperature of the radiation plate 210 based on this heat value. The controller 300 adjusts the temperature of the coolant based on the calculated temperature of the radiation plate 210, which the circulation part 220 supplies and circulates, and cools the radiation plate 210 so that the temperature of the optical element M becomes at the predetermined value through radiation (step 1010). The step 1010 thus forms a temperature difference between the optical element M and the radiation plate 210. Therefore, the radiation plate 210 absorbs the heat from the optical element M through radiation, and may maintain the temperature of the optical element M to be the predetermined value. When the detected temperature of the optical element M is equal to the predetermined value, the procedure from the step 1004 is repeated during exposure or while the exposure light L is irradiated onto the optical element M.

Therefore, the cooling apparatus 1 and the cooling method 1000 may cool the optical element provided in the vacuum atmosphere in a non-contact manner, and achieve desired optical performance by reducing deformation of the optical element due to thermal expansion which would otherwise deteriorate imaging performance.

It is not necessary that the step 1002 in the flowchart shown in FIG. 2 sets the initial temperature of the optical element M to be the predetermined value. The predetermined value may be the temperature at which the optical element M may have a designed shape. For example, if it is known that the optical element M has a designed shape at the temperature of 23° C., the predetermined value is set to be 23° C. Of course, this value depends upon the apparatus, but preferably is between 22° C. to 24° C.

When the optical element M has a temperature distribution, there is sometimes a difference between the temperature detected by the detector 100 and the average temperature of the entire optical element M or between the temperature detected by the detector 100 and the average temperature on the irradiated or incident area on the optical element M. In this case, the (average) temperature of the optical element M may be inferred based on the temperature detected by the detector 100 singularly or in combination with the temperature inside the chamber VC detected by a thermometer or temperature detector means (not shown), and cooling may be controlled based on the inferred temperature.

Figure 3:
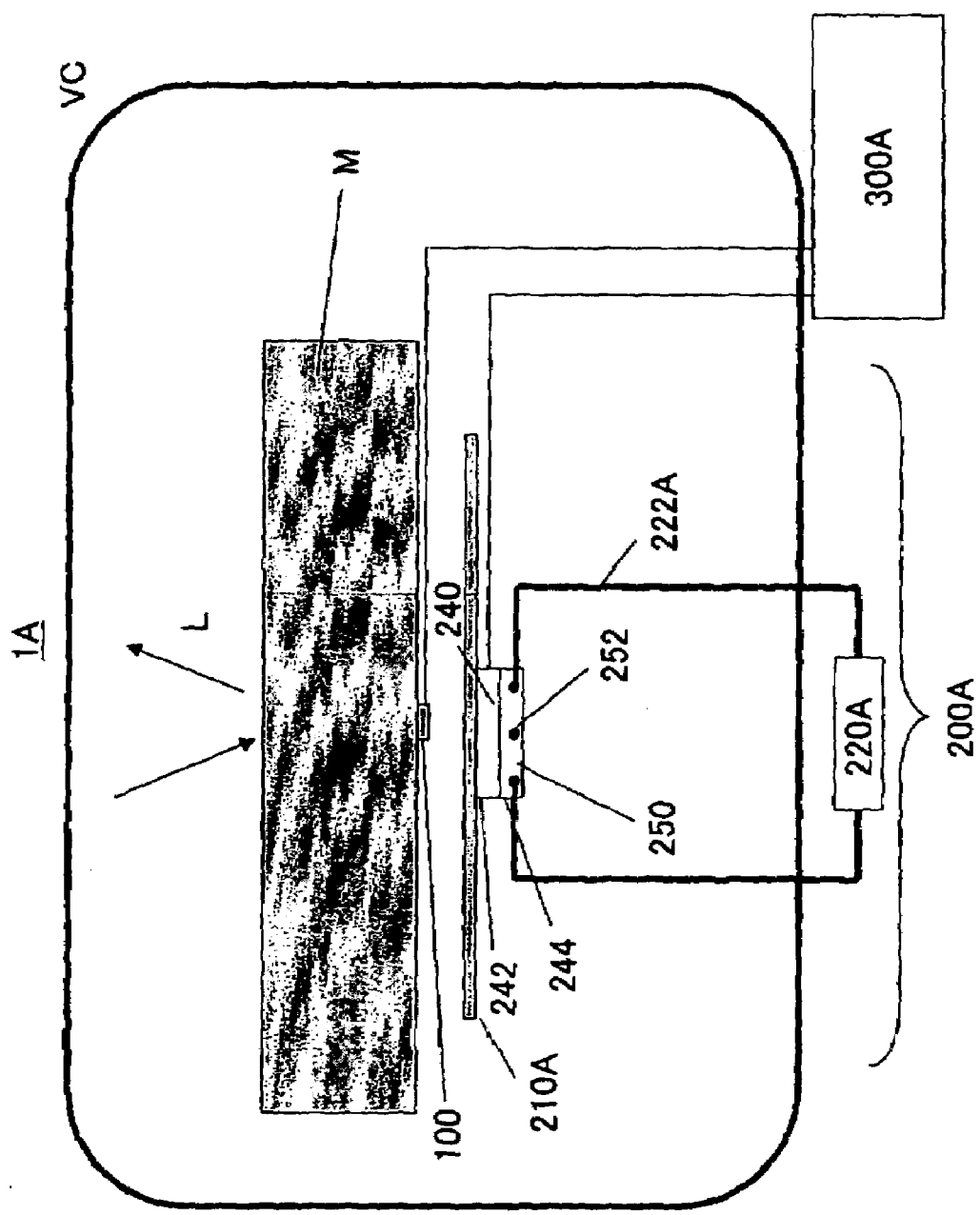
FIG. 3 is a schematic structure of a cooling apparatus as a variation of the cooling apparatus shown in FIG. 1.

A description will be given of a cooling apparatus 1A as a variation of the cooling apparatus 1 with reference to FIGS. 3 to 5. The cooling apparatus 1A is different from the cooling apparatus 1 in having radiation cooling mechanism 200A and controller 300A. Here, FIG. 3 is a schematic structure of a cooling apparatus 1A as a variation of the cooling apparatus 1, although FIG. 3 omits the optical-element support stool MP, optical-element support member MB shown in FIG. 1 for positioning the optical element M, radiation-plate support stool 212 and radiation-plate support member 214 to position the radiation plate 210A.

Similar to the cooling apparatus 1, the cooling apparatus 1A is one for cooling an optical element M provided in a vacuum chamber VC that is maintained to be high vacuum, for example, about $1 \times 10^6$ [Pa] by a vacuum pump (not shown). The instant embodiment describes the optical element M as a mirror. The cooling apparatus 1A includes, as shown in FIG. 3, a detector 100, a radiation cooling mechanism 200A, and a controller 300A.

The radiation cooling mechanism 200A is provided at a position opposite to and apart from the optical element M (at a side opposite to an incident side of the exposure light L), and absorbs heat from the optical element M through radiation. The radiation cooling mechanism 200A includes a radiation plate 210A, a Peltier element 240, a radiation block 250, and a circulation part 220A.

The radiation plate 210A is fixed apart by an interval C from the optical element M through a radiation-plate support member (not shown) supported by a radiation-plate support stool (not shown). The radiation plate 210A is coupled with the Peltier element 240, and cooled by a Peltier effect of the Peltier element 240, becoming at a low temperature and forming a temperature difference from the optical element M. In other words, the radiation plate 210A absorbs the heat from the optical element M due to the temperature difference. The radiation plate 210A and the Peltier element 240 are jointed with each other using metallization, such as soldering, which has small emission gas amount and good thermal conductivity, rather than adhesives which would cause emission gas and contaminate the surface of the optical element M. The radiation plate 210A is made of a material having comparatively good heat conductivity and high emissivity, such as aluminum nitride of ceramics (AlN).

Figure 4:
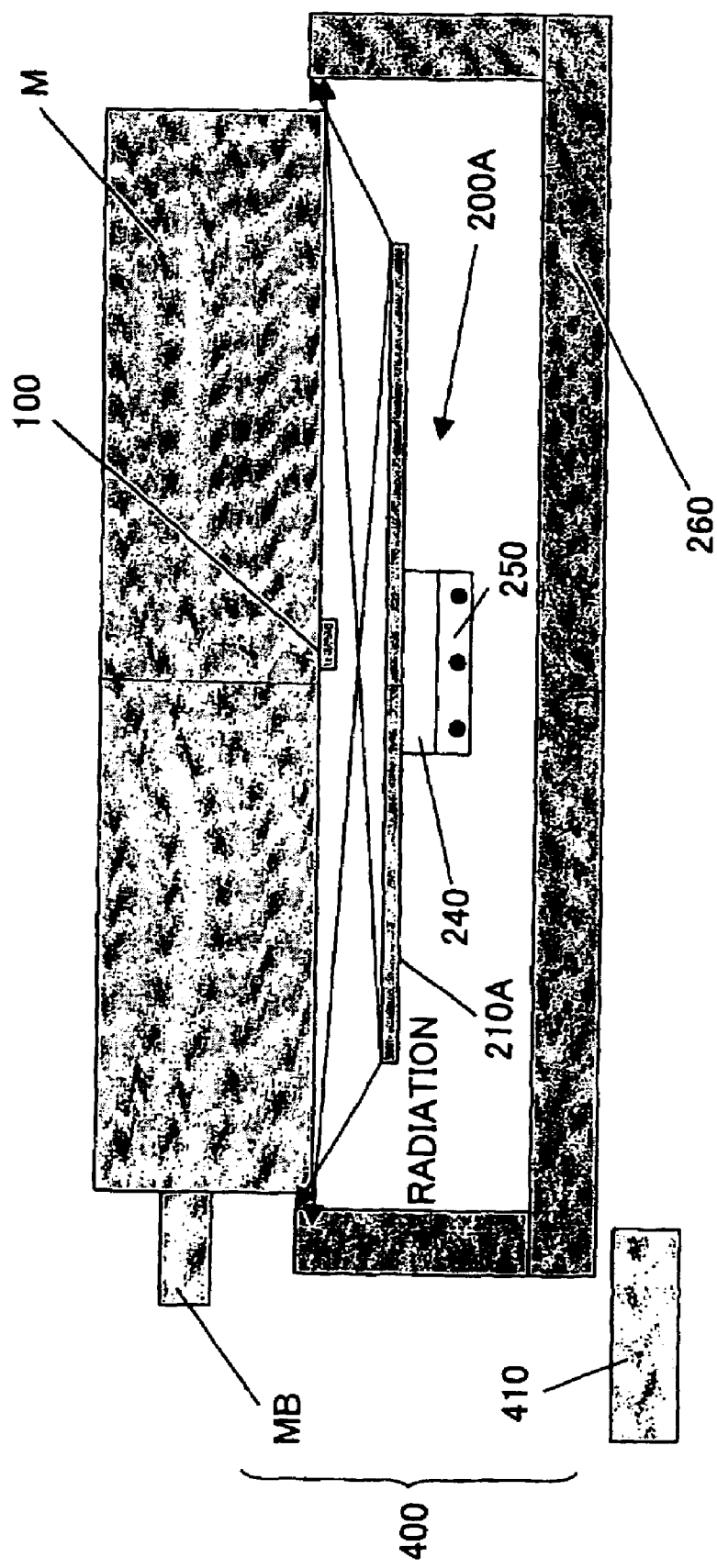
FIG. 4 is an enlarged structure of a principal part of a radiation cooling mechanism.

A radiation shielding member 260 may be provided as shown in FIG. 4 when the radiation plate 210A cools a member other than the optical element M, for example, a reference position member 400. The reference position member 400 is one which fluctuates a position of the optical element M and causes deterioration of the optical performance of the optical element M when a fixing member 410 for fixing a laser interferometer that detects a stage position and the optical-element support member MB for supporting the optical element M. Here, FIG. 4 is an enlarged structure of a principal part of the radiation cooling mechanism 200A. Of course, the radiation shielding member 260 may be provided in the cooling apparatus 1.

The radiation shielding member 260 is made of a heat insulation material, and located between the radiation plate 210A and reference position member 400. The radiation shielding member 260 prevents the radiation plate 210A from absorbing heat from a member other than the optical element M, for example, the reference position member 400 through radiation. Therefore, the radiation shielding member 260 prevents the reference position member 400 from being cooled by the radiation plate 210A, and does not fluctuate a position due to temperature change of the reference position member 400, or deteriorate the optical performance of the optical element M.

Figure 5:
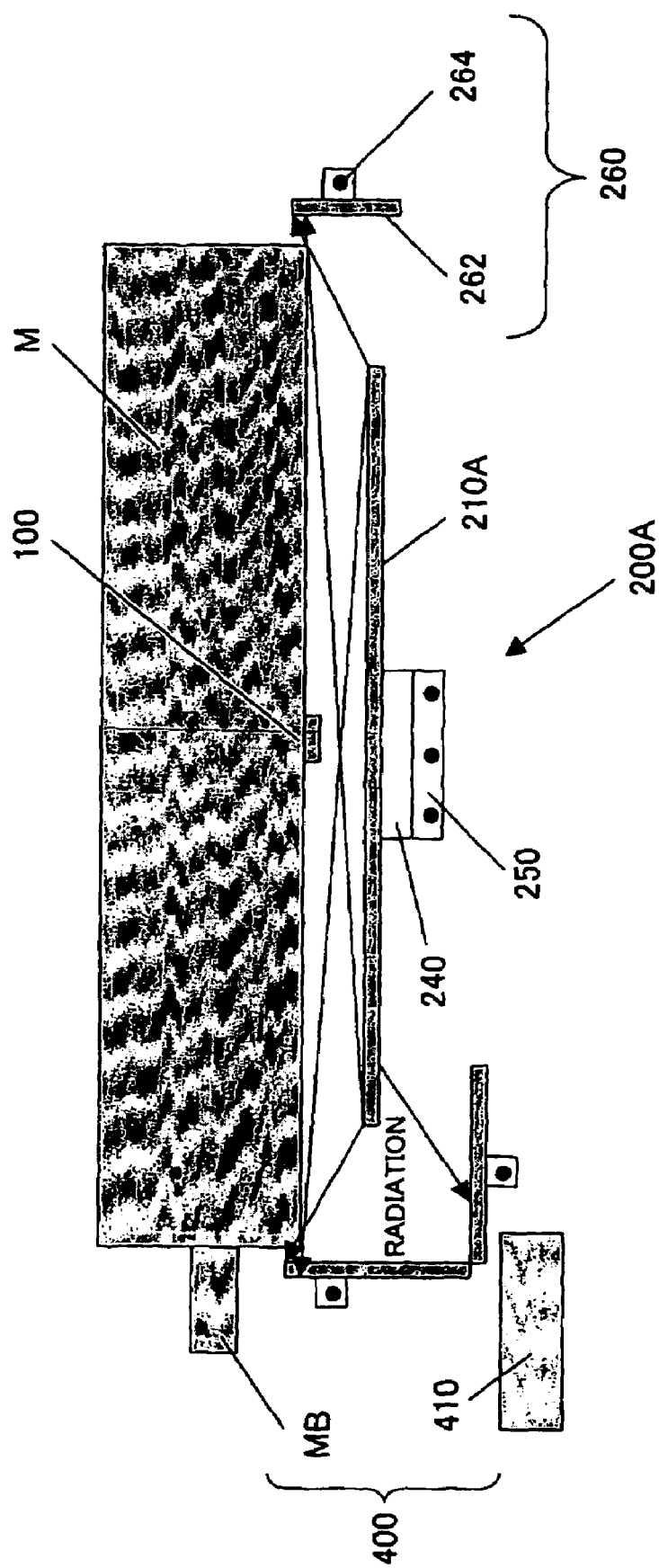
FIG. 5 is an enlarged structure of a principal part of a radiation cooling mechanism.

The radiation shielding member 260 includes, as shown in FIG. 5, a plate 262 and a channel 264 for the coolant to flow through. The plate 262 is provided between the radiation plate 210A and the reference position member 400, and prevents the radiation plate 210A from absorbing the heat from the reference position member 400 through radiation. The plate 262 has the temperature equal to that of the coolant when the coolant flows through the channel 264. Therefore, when the coolant that has the temperature equal to that of the reference position member 400 flows through the channel 264, the plate 262 becomes at the temperature equal to the reference position member 400, eliminating the temperature difference, and preventing the positional fluctuation due to the temperature change of the reference position member 400. The plate 262 that includes the channel 264 forms the radiation shielding member 260, and achieves a smaller space than the heat insulation material. FIG. 5 is an enlarged structure of a principal part of the radiation cooling mechanism 200.

The radiation shielding member 260 may be arranged so that it covers the radiation plate 210A and the Peltier element 240 as shown in FIG. 4, or may be arranged at a side of the radiation plate 210A as shown in FIG. 5. As shown in FIGS. 4 and 5, the radiation plate 210A and the radiation shielding member 260 may be separated from each other.

The Peltier element 240 arranges, for example, a p-type semiconductor and an n-type semiconductor thermally parallel to each other. The Peltier element 240 is controlled by the controller 300A, which will be described later, and coupled with the radiation plate 210A to cool the radiation plate 210A using a Peltier effect. The "Peltier effect" is a phenomenon in which the heat transfers due to a difference of electric conductivity when the current flows through two types of contacts of conductors or semiconductors. The instant embodiment makes the Peltier element 240 of a p-type semiconductor and an n-type semiconductor. Electrons have a difficulty to flow on an area from the p-type semiconductor to the n-type semiconductor, forming a heat absorption surface 242, whereas electrons easily flow through an area from the n-type semiconductor to the p-type semiconductor, forming a heat radiation surface 244. Therefore, a joint of the heat absorption surface 242 of the Peltier element 240 with the radiation plate 210A would absorb the heat from the radiation plate 210A and cool the radiation plate 210A. The heat value which the Peltier element 240 may absorb is adjustable by applied voltage. The Peltier element 240 has high responsiveness, precisely controls the temperature of the radiation plate 210A, and maintains the temperature of the optical element M to a predetermined value. The radiation block 250 is coupled with the heat radiation surface 244 of the Peltier element 240.

The radiation block 250 is coupled with the heat radiation surface 244 of the Peltier element 240 through metal, which reduces emission gas amount and improves the thermal conductivity. The radiation block 250 includes a channel 252 for the coolant to flow through, which the circulation part 220A supplies as will be described later. The channel 252 is connected to the circulation part 220A through the pipe 222A. The channel 252 is formed over the entire surface in the radiation block 250, and enables the coolant to flow through the entire surface in the radiation block 250. The radiation block 250 collects the heat from the optical element M absorbed via the radiation plate 210A, which is cooled by the coolant and exhausted from the heat radiation surface 244 of the Peltier element 240. The radiation block 250 is made, for example, of aluminum nitride of ceramics (AlN).

The circulation part 220A is connected to a pipe 222A, supplies the coolant to and circulates the coolant through the channel 252 in the radiation block via the pipe 222A. The coolant which the circulation part 220A supplies to and circulates through the channel 252 is to collect the heat from a heat exhausting surface 252 of the radiation block 250. Therefore, it is unnecessary to make the temperature of the coolant variable or remarkably low. For example, the coolant may have the temperature of 23° C. in attempting the temperature of the optical element M to maintain at 23° C. In other words, the circulation part 220A may supply and circulate the coolant having the certain temperature, which is, for example, the temperature of the optical element M to be controlled. This prevents the pipe 222A from changing its temperature during circulation, the optical element from offsetting its position, and a member from cooling which would otherwise deteriorate the optical performance of the optical element, such as the reference position member 400 shown in FIGS. 4 and 5, laser-interferometer fixing member and optical-element support member. Of course, the coolant circulated in and/or supplied to the circulation part 220A, in particular, the coolant circulated in and/or supplied from the circulation part 220A to the pipe 222A has temperature T(220) that meets the following equation with desired temperature T(M) of the optical element M to be maintained T(M)−5° C.<T(220)<T(M)+1° C., more preferably, T(M)−1° C.<T(220)<T(M)+1° C., most preferably, T(M)−0.2° C.<T(220)<T(M)+0.2° C.

The controller 300A controls the radiation cooling mechanism 200A so that the temperature of the optical element M detected by the detector 100 may be a predetermined value. More specifically, the controller 300A controls the temperature of the radiation plate 210A by changing the voltage applied to the Peltier element 240. In other words, the controller 300 calculates the heat value to be absorbed by the radiation plate 210A, and determines the temperature of the radiation plate 210A based on the heat value. Moreover, the controller 300A adjusts the voltage applied to the Peltier element 240 based on the determined temperature of the radiation plate 210A. This control adjusts the heat value absorbed by the radiation plate 210A from the optical element M, and the optical element M becomes at a predetermined value. In other words, the controller 300A serves to maintain the temperature of the optical element M to be constant.

The cooling apparatus 1A uses the Peltier element 240 having good temperature responsiveness for the radiation cooling mechanism 200A, improves the temperature control over the radiation plate 210A, and precisely stabilizes the temperature of the optical element M. The radiation shielding member 260 may prevents the temperature change of a member other than the optical element M, in particular the reference position member 400, eliminating the positional fluctuation due to the temperature change. The cooling apparatus 1A may cool the optical element provided in the vacuum atmosphere in a non-contact manner, and realize desired optical performance by reducing deformation of the optical element due to thermal expansion which would otherwise deteriorate imaging performance. A cooling method for cooling the optical element M using the cooling apparatus 1A is similar to the cooling method 1000 that has been discussed with reference to FIG. 2, and a detailed description will be omitted.

Figure 6:
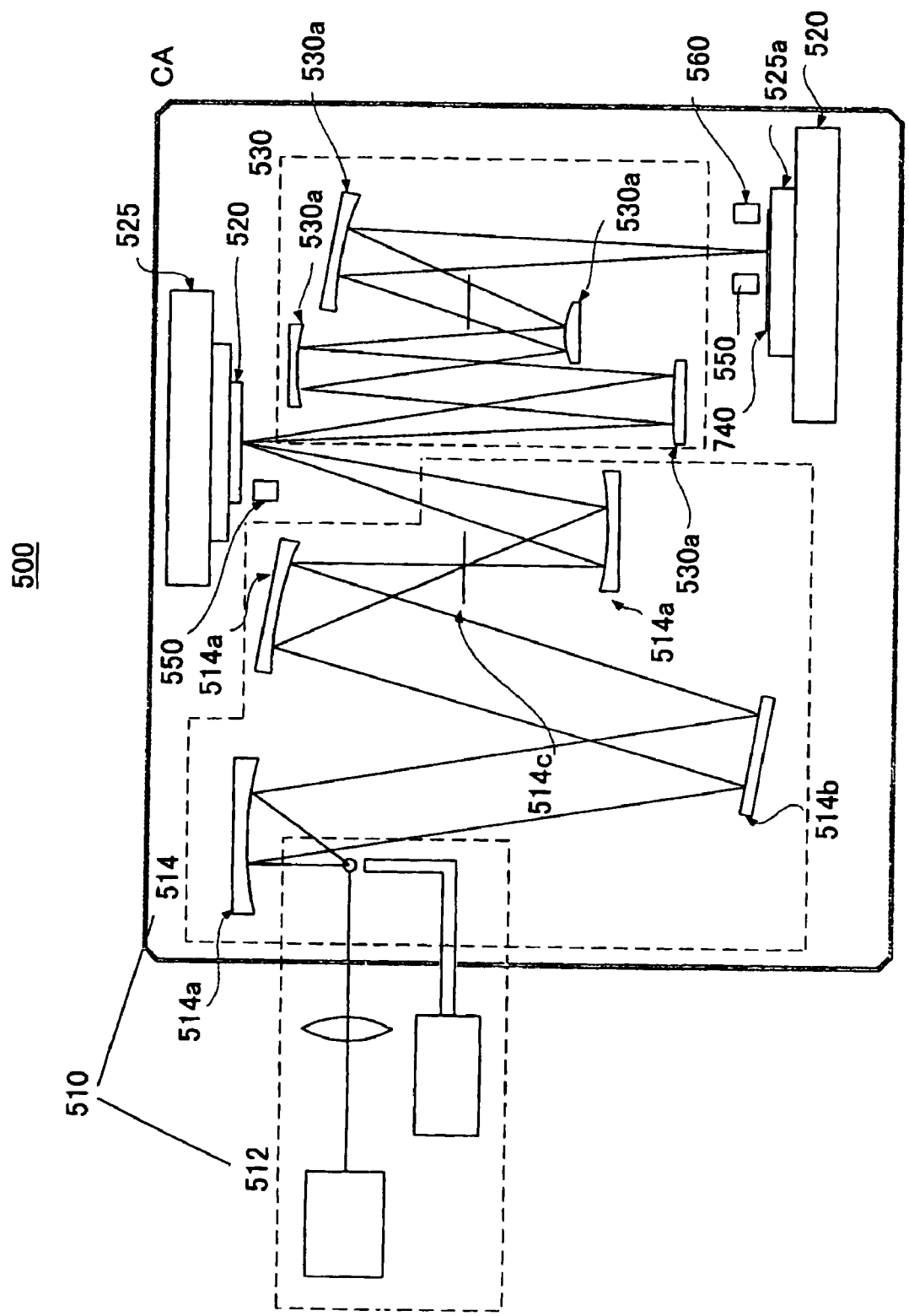
FIG. 6 is a schematic structure of an illustrative exposure apparatus according to the present invention.

A description will be given of an exemplary inventive exposure apparatus 500 with reference to FIG. 6. Here, FIG. 6 is a schematic structure of an illustrative inventive exposure apparatus 500. The inventive exposure apparatus 500 is a projection exposure apparatus that uses EUV light with a wavelength of 13.4 nm as exposure light to expose onto the plate 540 a circuit pattern created on the mask 520, e.g., in a step-and-repeat or a step-and-scan manner. Such an exposure apparatus is suitably applicable to a submicron or quarter-micron lithography process, and a description will be given below of this embodiment taking a step-and-scan exposure apparatus (which is also called "a scanner") as an example. The step-and-scan manner, as used herein, is an exposure method that exposes a mask pattern onto a wafer by continuously scanning the wafer relative to the mask, and by moving, after a shot of exposure, the wafer stepwise to the next exposure area to be shot. The step-and-repeat manner is another mode of exposure method that moves a wafer stepwise to an exposure area for the next shot every shot of cell projection onto the wafer.

Referring to FIG. 6, the exposure apparatus 500 includes an illumination apparatus 510, a mask 520, a mask stage 525 that mounts the mask 520, a projection optical system 530, an object to be exposed 540, a wafer stage 545 that mounts the object 540, and an alignment detection mechanism 550, and a focus position detection mechanism 560.

An optical path through which EUV light passes or an entire optical system is preferably maintained in a vacuum atmosphere VC due to low transmittance to air of the EUV light and a generation of contamination through a reaction with residual gas, such as polymer organic gas, as shown in FIG. 6.

The illumination apparatus 510 uses arc-shaped EUV light, for example, with a wavelength of 13.4 corresponding to an arc-shaped field of the projection optical system 530 to illuminate the mask 520, and includes an EUV light source 512 and illumination optical system 514.

The EUV light source 512 employs, for example, a laser plasma light source. It generates high temperature plasma by irradiating a pulsed laser beam with high intensity onto a target material in a vacuum chamber, and uses the EUV light, for example, with a wavelength of about 13 nm, which has been emitted from the plasma. The target material may use a metallic thin film, an inert gas, a liquid-drop, etc., and the target supply unit may use a gas jet and so on. The pulse laser is usually driven with a higher repetitive frequency, such as several kHz, for increased average intensity of radiated EUV light.

The illumination optical system 514 includes a condenser mirror 514a, and an optical integrator 514b. The condenser mirror 514a serves to collect the EUV light that is isotropically irradiated from the laser plasma. The optical integrator 514b serves to uniformly illuminate the mask 520 with a predetermined NA. The illumination optical system 514 further includes an aperture 514c to limit the illumination area to an arc shape at a position conjugate with the mask 520. An optical element in the illumination optical system 514 such as the condenser mirror 514a and optical integrator 514b may apply the inventive cooling apparatus 1 and cooling method 1000. The cooling apparatus 1 cools the condenser mirror 514a and optical integrator 514b, prevents deformation due to the thermal expansion, and realizes superior imaging performance.

The mask 520 is a reflection-type mask that forms a circuit pattern or image to be transferred, and supported and driven by the mask stage 525. The diffracted light from the mask 520 is reflected by the projection optical system 530 and projected onto the object 540. The mask 520 and the object 540 are arranged optically conjugate with each other. The exposure apparatus 500 is a step-and-scan exposure apparatus, and projects a reduced size of the pattern on the mask 520 on the object 540 by scanning the mask 520 and the object 540.

The mask stage 525 supports the mask 520 and is connected to a moving mechanism (not shown). The mask stage 525 may use any structure known in the art. A moving mechanism (not shown) may include a linear motor etc., and drives the mask stage 525 at least in a direction X and moves the mask 520. The exposure apparatus 500 assigns the direction X to scan the mask 520 or the object 540, a direction Y perpendicular to the direction X, and a direction Z perpendicular to the mask 520 or the object 540.

The projection optical system 530 uses plural multilayer mirrors 530a to project a reduced size of a pattern formed on the mask 520 onto the object 540. The number of mirrors 530a is about four to six. For wide exposure area with the small number of mirrors, the mask 520 and object 540 are simultaneously scanned to transfer a wide area that is an arc-shaped area or ring field apart from the optical axis by a predetermined distance. The projection optical system 530 has a NA of about 0.2 to 0.3. An optical element in the projection optical system 530 such as the mirror 530a may apply the inventive cooling apparatus 1 and cooling method 1000. The cooling apparatus 1 cools the mirror 530a, prevents deformation due to the thermal expansion, and realizes superior imaging performance.

The instant embodiment uses a wafer as the object to be exposed 540, but it may include a spherical semiconductor and liquid crystal plate and a wide range of other objects to be exposed. Photoresist is applied onto the object 540. A photoresist application step includes a pretreatment, an adhesion accelerator application treatment, a photoresist application treatment, and a pre-bake treatment. The pretreatment includes cleaning, drying, etc. The adhesion accelerator application treatment is a surface reforming process so as to enhance the adhesion between the photoresist and a base (i.e., a process to increase the hydrophobicity by applying a surface active agent), through a coat or vaporous process using an organic film such as HMDS (Hexamethyldisilazane). The pre-bake treatment is a baking (or burning) step, softer than that after development, which removes the solvent.

An object to be exposed 540 is held onto the wafer stage 545 by a wafer chuck 545a. The wafer stage 545 moves the object 540, for example, using a linear stage in XYZ directions. The mask 520 and the object 540 are synchronously scanned. The positions of the mask stage 525 and wafer stage 545 are monitored, for example, by a laser interferometer, and driven at a constant speed ratio.

The alignment detection mechanism 550 measures a positional relationship between the position of the mask 520 and the optical axis of the projection optical system 530, and a positional relationship between the position of the object 540 and the optical axis of the projection optical system 530, and sets positions and angles of the mask stage 525 and the wafer stage 545 so that a projected image of the mask 520 may be positioned in place on the object 540.

A focus detection optical system 560 measures a focus position in the direction Z on the object 540 surface, and control over a position and angle of the wafer stage 545 may always maintain the object 540 surface at an imaging position of the projection optical system 530 during exposure.

In exposure, the EUV light emitted from the illumination apparatus 510 illuminates the mask 520, and images a pattern formed on the mask 520 onto the object 540 surface. The instant embodiment uses an arc or ring shaped image plane, scans the mask 520 and object 540 at a speed ratio corresponding to a reduction ratio to expose the entire surface of the mask 520.

As the optical performance is sensitive to a surface shape of the optical element in the projection optical system in the exposure apparatus, the above radiation cooling mechanism is often used for an optical element in the projection optical system, in particular, an optical element at a mask side that receives much light intensity. Of course, it may be used for the illumination optical system. In particular, the reflection optical element closest to a light source receives a large amount of light among the optical elements, generates the large absorbed heat value inevitably, and the absorbed heat value deforms the shape of the optical element. In order to prevent these problems, the above radiation cooling mechanism prevents the temperature rise due to absorption of a large amount of light, and reduces the shape change of the optical element.

Figure 7:
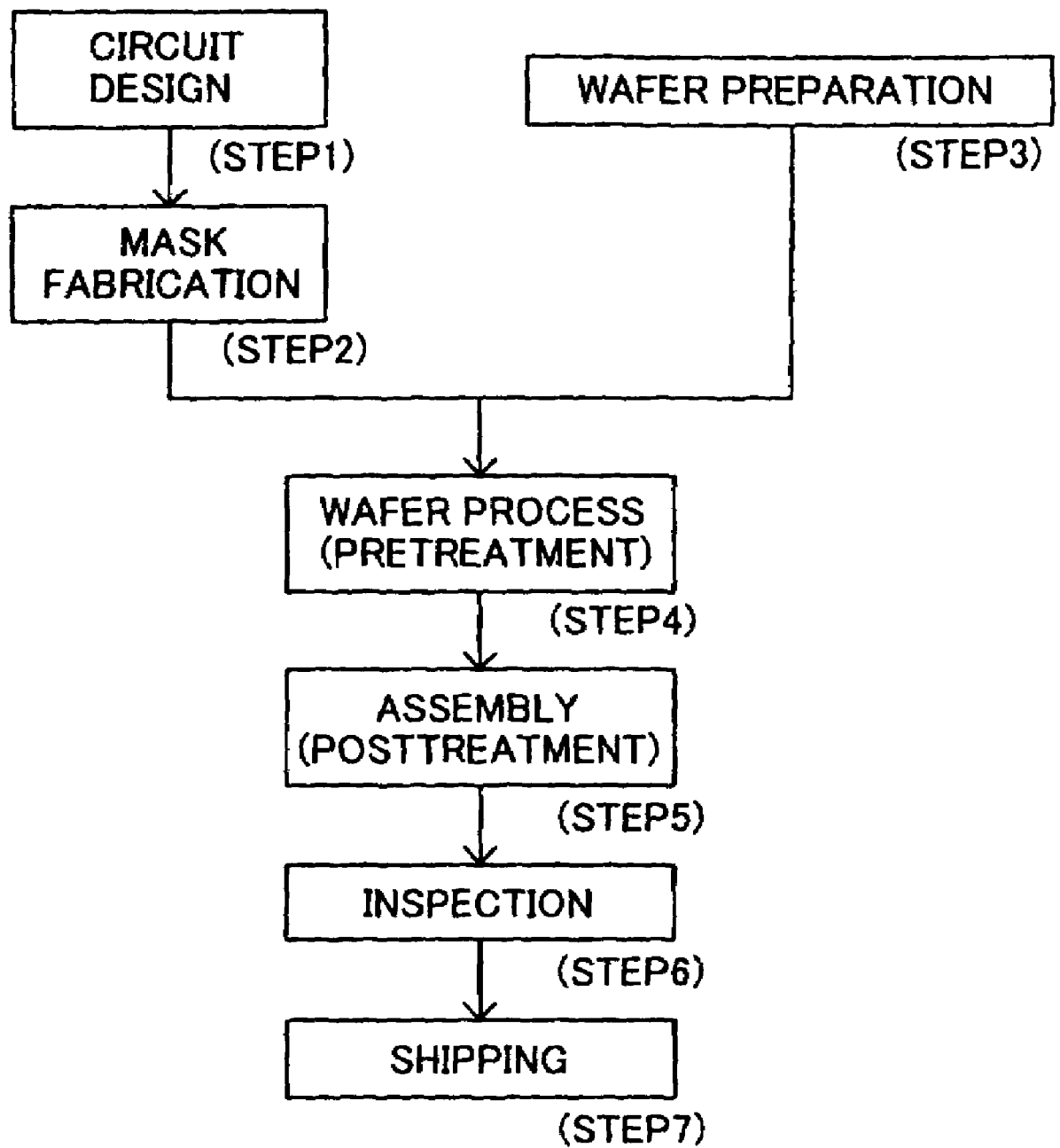
FIG. 7 is a flowchart for explaining how to fabricate devices (such as semiconductor chips such as ICs and LCDs, CCDs, and the like).
Figure 8:
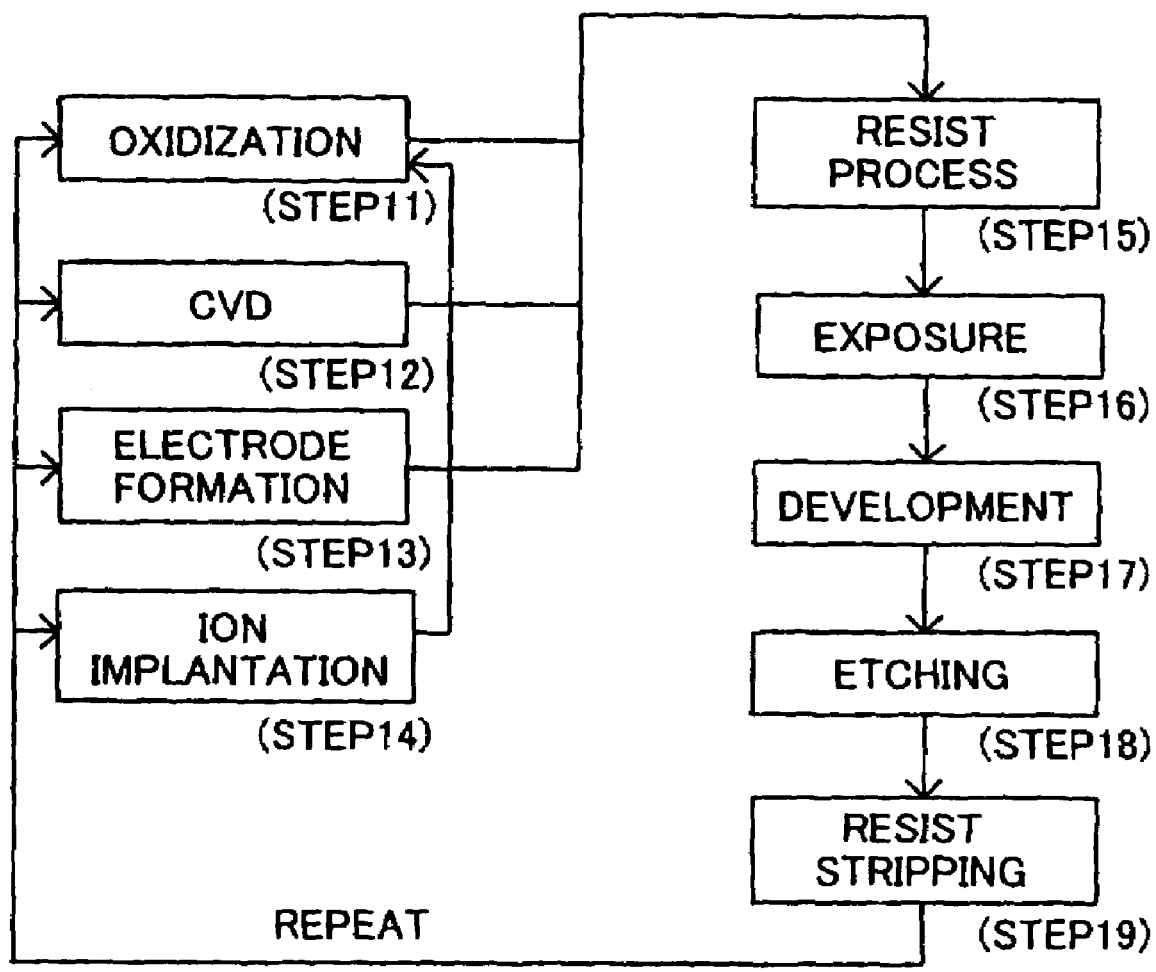
FIG. 8 is a detail flowchart of a wafer process as Step 4 shown in FIG. 7.
Figure 9A:
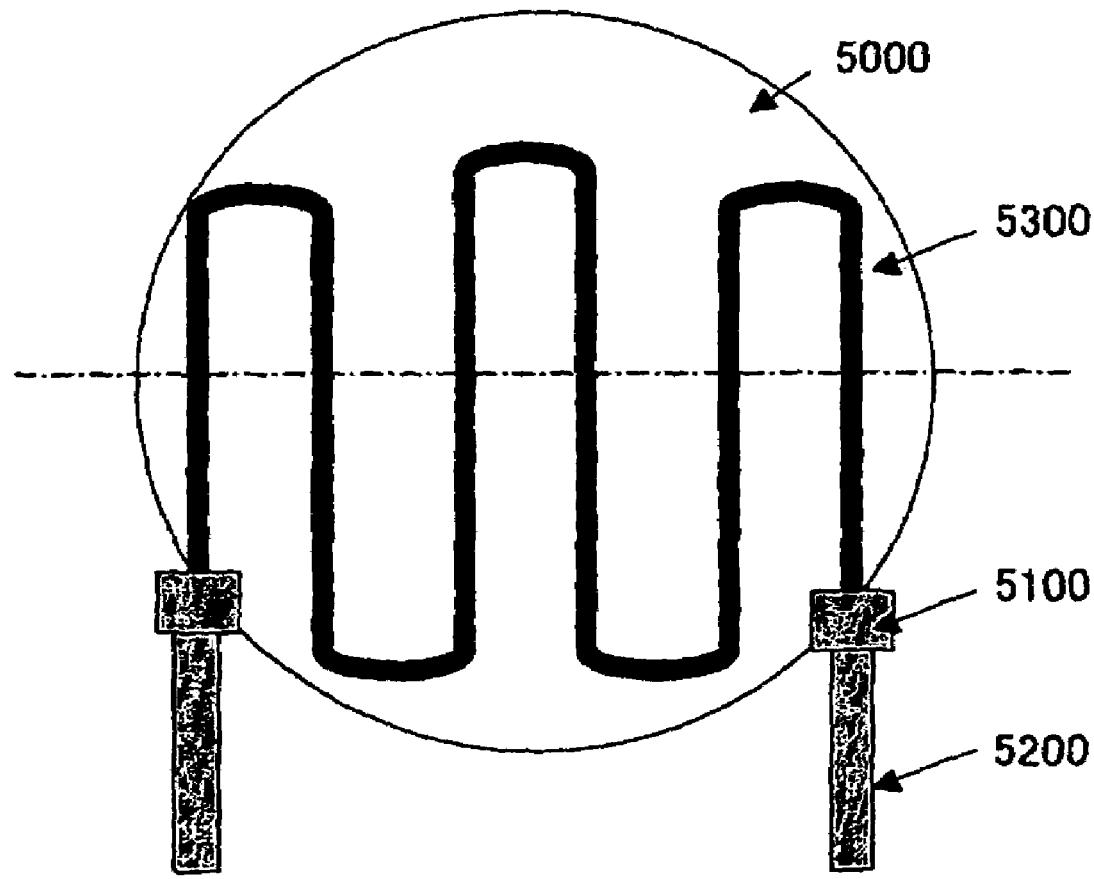
FIG. 9A is a schematic transparent plane view of a mirror.
Figure 9B:
FIG. 9B is a schematic sectional view of the mirror.

Referring now to FIGS. 7 and 8, a description will be given of an embodiment of a device fabricating method using the above exposure apparatus 500. FIG. 7 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 8 is a detailed flowchart of the wafer process in Step 4 in FIG. 7. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 200 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device fabrication method of this embodiment may manufacture a higher quality device than the conventional method.

Further, the present invention is not limited to these preferred embodiments, and various variations and modifications may be made without departing from the scope of the present invention. For example, the present invention is applicable to an optical element for ultraviolet having a wavelength of 200 nm or smaller in addition to the EUV light, such as ArF excimer laser and $F_2$ laser, as well as a mask and a wafer.

Thus, the inventive cooling apparatus and method may cool an optical element provided in a vacuum atmosphere in a non-contact manner, provide intended optical performance by reducing deformation of an optical element due to thermal expansion that would otherwise deteriorate imaging performance.

What is claimed is:

1. An exposure apparatus for exposing a pattern onto an object, said exposure apparatus comprising:
    an optical element provided in a vacuum atmosphere; and
    a cooling apparatus for cooling the optical element using a radiation cooling,
    wherein said cooling apparatus comprises:
        a board arranged apart from the optical element, said board having a temperature that is smaller than a temperature of the optical element;
        a Peltier element having a heat absorption surface and a heat radiation surface, and connected to the board through the heat absorption surface;
        a radiation block connected to said Peltier element through the heat radiation surface, said radiation block having a channel to flow a coolant for cooling the heat radiation surface and being placed in a vacuum atmosphere; and
        a controller for controlling temperature of said board by changing voltage applied to said Peltier element;
    wherein said cooling apparatus cools said optical element by controlling the temperature of said board and maintains a temperature of the coolant to a predetermined temperature.

2. An exposure apparatus according to claim 1, further comprising a detector for detecting temperature of the optical element,
    wherein a temperature of the heat absorption surface is controlled based on the temperature detected by the detector.

3. An exposure apparatus according to claim 1, wherein said optical element is a mirror.

4. An exposure apparatus according to claim 3, wherein said board faces a rear surface of the mirror.

5. An exposure apparatus according to claim 1, further comprising a radiation shield member to shield radiation heat transfer between the board and a member different from the optical member.

6. An exposure apparatus according to claim 1, wherein a difference between the temperature of the coolant and the temperature of the optical element is less than 5° C.

7. An exposure apparatus according to claim 1, wherein a difference between the temperature of the coolant and the temperature of the optical element is less than 1° C.

8. An exposure apparatus according to claim 1, wherein a difference between the temperature of the coolant and the temperature of the optical element is less than 0.2° C.

9. A device fabrication method comprising the steps of:
    exposing an object to a pattern using an exposure apparatus according to claim 1; and developing the exposed object.

* * * * *